United States Patent
Abbott et al.

(10) Patent No.: US 6,365,974 B1
(45) Date of Patent: Apr. 2, 2002

(54) FLEX CIRCUIT SUBSTRATE FOR AN INTEGRATED CIRCUIT PACKAGE

(75) Inventors: Donald C. Abbott, Norton, MA (US); Raymond A. Frechette, North Providence, RI (US); Robert Sabo, Smithfield, RI (US); Steve Smith, Lincoln, RI (US); Christopher Sullivan, Rochester; David West, Pembroke, both of MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/531,387

(22) Filed: Mar. 21, 2000

Related U.S. Application Data (60) Provisional application No. 60/125,735, filed on Mar. 23, 1999.

(51) Int. Cl.[7] ................................................ H01L 23/48
(52) U.S. Cl. ........................ 257/774; 257/723; 257/686
(58) Field of Search ................................ 257/774, 723, 257/686

(56) References Cited

U.S. PATENT DOCUMENTS 5,691,245 A * 11/1997 Bakhit et al. ............... 437/209

* cited by examiner

*Primary Examiner*—Roy Potter
(74) *Attorney, Agent, or Firm*—Gary C. Honeycutt; Fred Telecky; Arthur I. Navarro

(57) ABSTRACT

A double sided electrical connection flexible circuit particularly useful as a substrate for an area array integrated package, and the method of fabricating the structure is described. A circuit having interconnections on one surface and solder ball contact pads on the second surface are interconnected by copper plated from a single surface in order to avoid entrapment of air pockets. In one embodiment, the conductive vias are formed from a copper film which extends from the solder ball contact pads, which may be indented, providing a well for solder balls in the contact pad.

9 Claims, 6 Drawing Sheets

FLEX CIRCUIT SUBSTRATE FOR AN INTEGRATED CIRCUIT PACKAGE

This application claims priority under 35 U.S.C. §119 based upon Provisional Patent Application No. 60/125,735, filed Mar. 23, 1999.

FIELD OF THE INVENTION

The present invention relates generally to integrated circuit packages and more particularly to a method of fabricating flex circuit substrates.

BRIEF DESCRIPTION OF RELATED ART

As the demand for cheaper, faster and lower power consuming integrated circuits increases, so must the device packing density at the circuit board level. Not only have techniques continually evolved to meet the demand for minimizing dimensions of the transistors and of the electrical interconnections which integrate semiconductor devices, but also the packaging technology has advanced, resulting in smaller integrated circuit packages with improved electrical and thermal performance.

Figure 1A:
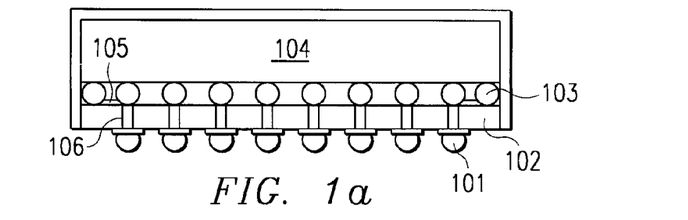
FIG. 1a is an example of an area array chip sized package with flex circuit substrate. (Prior art)
Figure 1B:
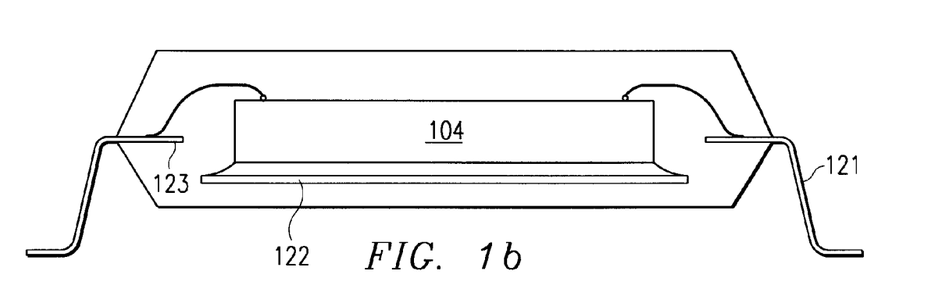
FIG. 1b is an example of a leaded package with lead frame. (Prior art)

Ball Grid Array (BGA) and many Chip Scale Packages (CSP) are integrated circuit packages which are assembled to an external circuit board using an array of solder balls confined within the area of the package. The solder balls are electrically connected to an external circuit board, and to the chip through vias and conductor traces in the package substrate. An example of an area array package is shown in FIG. 1a and is compared to a leaded package as illustrated in FIG. 1b. With area array packages, such as the CSP depicted in FIG. 1a, solder balls 101 eliminate the protruding leads 121 in FIG. 1b of leaded packages, and a printed circuit substrate 102 supports the die and provides electrical interconnection between the die and solder balls. The circuit board replaces the die support pad 122 and the internal lead frame 123 of leaded packages in FIG. 1b, thereby providing a more compact package. In addition, improved performance is realized by lower inductance of the shorter interconnection between the chip and the external circuit board.

Integrated circuit chips 104 are electrically connected to the interconnect circuitry on the substrate either by wire bonding or by flip chip 103 connections. Substrates typically are of rigid printed wiring board construction, or for smaller and more closely spaced circuits, the interconnections are made of an unsupported flexible (flex) circuit construction. Electrical connection between the printed circuitry 105 on the chip side of the substrate to the external contact solder balls on the opposite side is typically achieved by conductive vias 106 through the substrate.

Conventional fabrication of printed circuits is achieved by preparing an enlarged-scale artwork master of a circuit pattern and conductor paths, and then the enlarged-scale artwork master is photographically reduced to the desired size. Screens and masks are fabricated according to the reduced circuit pattern for application with photoresist materials. Processes including etching, screening, plating, laminating, vacuum deposition, via hole formation, and protective coating application are used to fabricated both supported printed circuits and unsupported flexible circuits.

Substrates for area array packages on flex circuits are most commonly fabricated on a dielectric polymer base film in reel or sheet format by applying a copper metal to both surfaces. The metal conductors may be a thin foil bonded to the base film, or may be vapor deposited and subsequently plating to the necessary thickness. Interconnect traces and contact pads are patterned and etched in the metal. Several techniques are known for electrically interconnecting the conductors and the contacts on either side of the substrate. Vias are typically formed by mechanical punching or by laser ablation, and the vias are filled with a conductor by plating, by metal deposition during the film metallization, or by filling with conductive pastes. Completing fabrication of the circuits includes plating a layer of nickel and a thin film of gold over the conductors to provide environmental protection and to support solder contacts. The final step is application of a solder mask coating to control the solder run out.

All of these fabrication techniques require multiple plating and etching steps, or in the case of laser ablation where one via is formed at a time, the repetitive process is time consuming. The vias forming steps require extensive cleaning and adhesion treatment prior to metallization. Further, the existing techniques for making conductive vias suffer from difficulties in making the through holes consistently conductive, and in aligning the top and bottom circuits to the vias. Via conductivity failures occur either as opens or as intermittent failures from thin conductor walls which open during thermal excursions due to expansion mismatch between the conductor and substrate, from incompletely coating by vapor deposition, from air pockets entrapped as metal is plated from both sides, from fatigue failures of the thin conductors, from marginal conductivity of the filling material, and from marginal contact due to misalignment.

It is accordingly desirable to provide a flex circuit and a method of fabrication that permits high volume production of reliable flex circuit substrates for integrated circuit area array packages in which the technique eliminates the reliability issues identified with current processes, which minimizes the specific tooling required for each circuit design, and which does not have the need for costly vapor deposition or multiple laser drilling steps.

SUMMARY OF THE INVENTION

The principal object of the present invention is to provide an intermediate structure for flex circuits including reliable conductive vias attached to conductors on both surfaces of a dielectric film. It is further an object of this invention to provide a method for fabricating a flex circuit substrate for integrated circuit area array packages having reliable, metal conductor vias which are easily aligned to the circuitry on both surfaces of the substrate, and a method which is amenable to mass production.

In accordance with one aspect of the current invention, a plurality of conductive vias are formed in a base dielectric film having a copper film adhered to the major surfaces of the dielectric film. Sites corresponding to conductive vias in a flex circuit are patterned on the first surface, and the copper film etched to expose the via site. The photoresist is removed and the copper serves as a mask for etching the dielectric film, preferably a polyimide based polymer. The exposed polymer is etched to create a plurality of cylindrical apertures which terminate at the copper film on the second surface of the dielectric. The polymer is etched vertically and to a lesser extent is etched horizontally leaving an overhanging cusp of copper on the first surface. A fluid force is used to stretch-form the copper on the second surface into the apertures so that it terminates on the plane of the copper film on the first surface. Using the formed, intact copper layer on the second surface as the cathode, copper is electroplated from the cathode to fill any space between the copper lined via and the copper film on the first surface. The electroplated copper serves to increase the conductor thickness, as well as to seal any voids thereby insuring robust electrical contact. Plating from a single surface eliminates voids and air pockets found with vias plated simultaneously from both surfaces. The solder ball contact pads of the preferred embodiment have an indentation caused by the conductive vias which are particularly well suited for locating solder balls used subsequently to attach the circuit to an external printed wiring board.

In a second embodiment, the intermediate structure for a flex circuit is fabricated like the preferred embodiment, and additional copper is electroplated onto the exposed copper surfaces of the via and contact, thereby filling the indentation to a selected cup size for solder ball placement.

In a related embodiment, a copper film on both major surfaces of a dielectric film is photopatterned to expose a plurality of vias sites, the exposed copper film is etched on both sides, and the dielectric is etched to provide apertures through the film having an overhanging cusp of copper on both surfaces. One surface of the copper is brought into intimate contact with the cathode of a copper electroplating solution, and the etched vias are plated from the cathode contact surface, resulting in air pocket free, solid metal vias. Alternately, the apertures can be mechanically punched, the dielectric chemically etched and cleaned resulting in apertures ready for plating and having an overhanging cusp of copper. The vias plated as above from a single side.

Each of the embodiments discloses an intermediate structure for a flex circuit including formation and filling of solid metal vias, which are in intimate contact with a continuous copper layer on each major surface of a dielectric film. Subsequently, photoresist will be laminated on the metallized surfaces, patterns for interconnection and solder ball contact pads will be aligned to the vias, and the conductors etched. The patterned conductors are plated with a thin film of nickel and gold in preparation for solder contacts, and a solder mask is applied to the completed circuit.

Reel to reel processing and transport are the preferred techniques for fabrication of substrates which may then be assembled into packages using the same format. However, the processes are not limited to this technique.

DETAILED DESCRIPTION OF THE INVENTION

Figure 2:
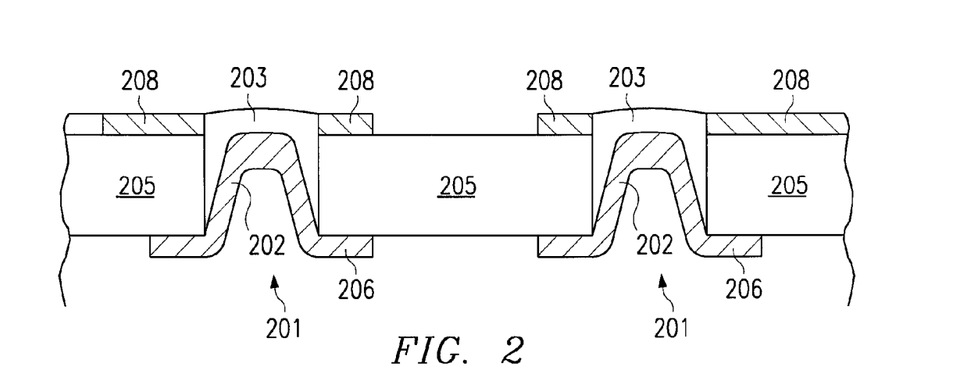
FIG. 2 is a cross section of an indented via of the current invention.

In accordance with the preferred embodiment of the current invention, a flex circuit substrate for an integrated circuit package is shown in FIG. 2, having a plurality of reliable, conductive vias 201 which interconnect the conductors 208 on the first surface of a flexible dielectric film 205 to a plurality of solder ball contact pads 206 on the second surface.

Unique, indentations in solder ball pads result from an inverted copper film segment 202 extending into vias, and plated copper 203 fills the cavity between the copper film and the conductor on the first surface. The copper film segment is attached to the second surface of the dielectric film, where solder ball contact pads 206 are defined and positioned. The indented pads 201 are particularly well suited for placement of solder balls which are subsequently used to attach area array packages, such as BGA or CSP packages to a printed wiring board.

Figure 3:
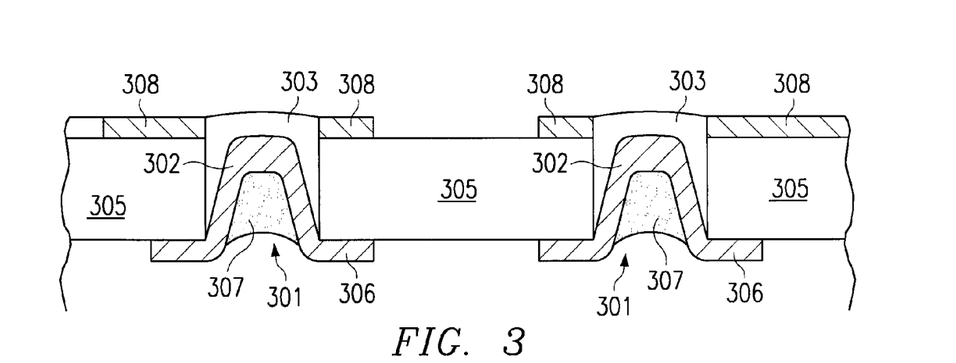
FIG. 3 shows a cross section of an indented via partially filled with copper.

A second embodiment of the current invention, illustrated in FIG. 3, includes the interconnection circuitry 308 on the first surface of a dielectric film 305, a plurality of conductive vias 301 having a copper film lining which extends to form solder ball contact pads 306 on the second surface. Plated copper 303 fills the space between the lining and the conductors on the first surface, as in the preferred embodiment. Further, the indented via structures include additional copper 307 which partially or fully fills the hollow space, thereby allowing selected cup size in the solder ball contact pad.

Figure 4:
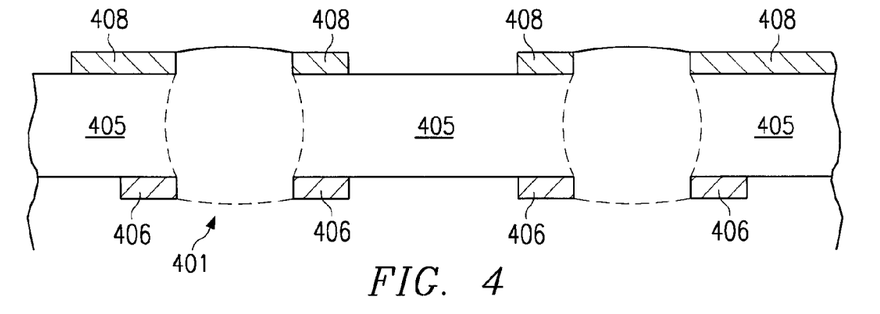
FIG. 4 is a cross section of an etched and plated via.

A third embodiment of the current invention comprises a flex circuit substrate for an integrated circuit package having a plurality of conductive vias 401 which interconnect the conductors 408 on the first surface of a flexible dielectric film 405 to a plurality of solder ball contact pads 406 as shown in FIG. 4. The conductive vias 401 comprise a solid core of plated copper which connects a cusp of the contact pad on the second surface to a cusp of the copper conductor on the first surface.

A film of nickel and of gold cover the exposed copper surfaces in each embodiment to protect against diffusion and environmental attack.

Figure 5A:
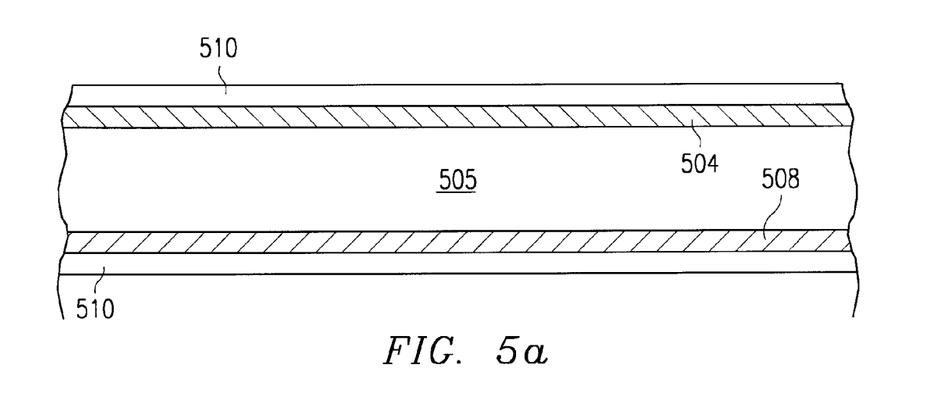
FIGS. 5a–5e illustrate process steps included in forming a conductive via from a continuous copper film on one surface of a dielectric film.

Turning now to a method of forming the flex circuit of the preferred embodiment of the current invention. In FIG. 5a, a commercially available flexible dielectric film 505, preferably comprising a polyimide based polymer, coated on both major surfaces with a conductive layer 504 and 508, comprising copper is laminated on both surfaces with a photoresist 510. The dielectric film thickness is in the range of 0.003 to 0.006 inches, and the copper layers are in the range of 0.0005 to 0.0015 inches in thickness.

Figure 5B:
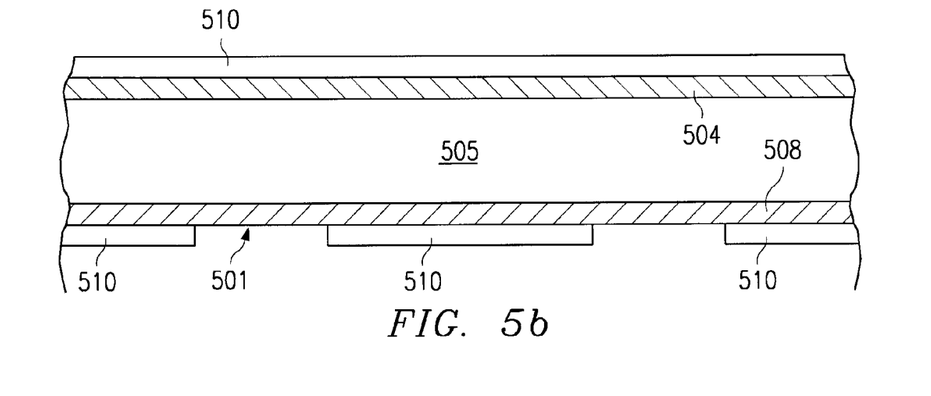
Figure 5C:
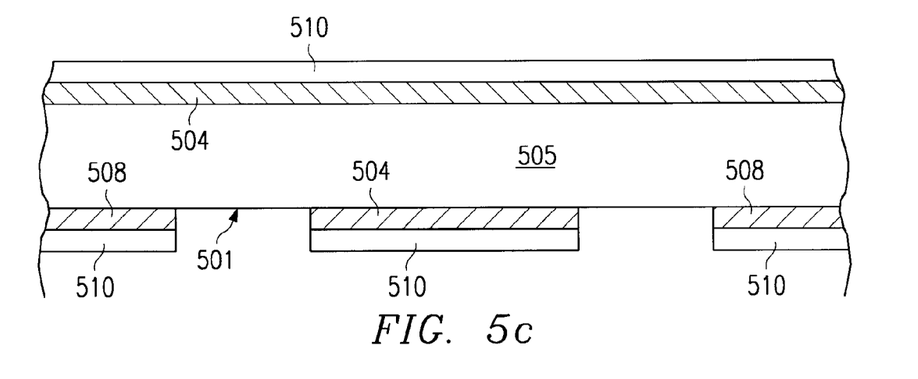

In FIG. 5b, a plurality of photoimaged sites corresponding to conductive via sites 501 in a flex circuit are exposed and developed to expose the copper layer 508 on the first surface of the film in a conventional manner, i.e., artwork is placed over the photoresist and the photoresist is exposed using a high intensity UV light source. In FIG. 5c, the copper is etched from the exposed via sites 501 using a commercially available copper etch solution, such as an ammoniacal etchant.

Figure 5D:
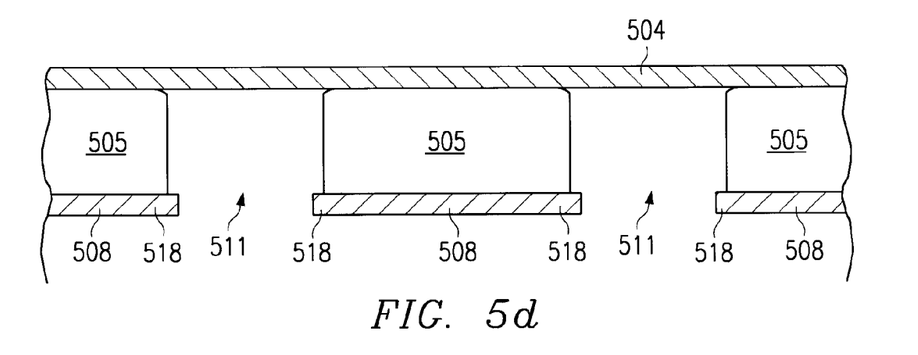

The photoresist is removed from both surfaces, by conventional process technology and in FIG. 5d, using the copper surfaces as a mask, cylindrical openings 511 are created in the polymeric film 505 by an alkaline etchant of known technology. The dielectric is etched to undercut the apertures in the copper 508 on the first surface resulting in cusps 518 of copper overhanging the etched sites. The copper film on the second surface 504 of the dielectric film is a continuous layer.

Figure 5E:
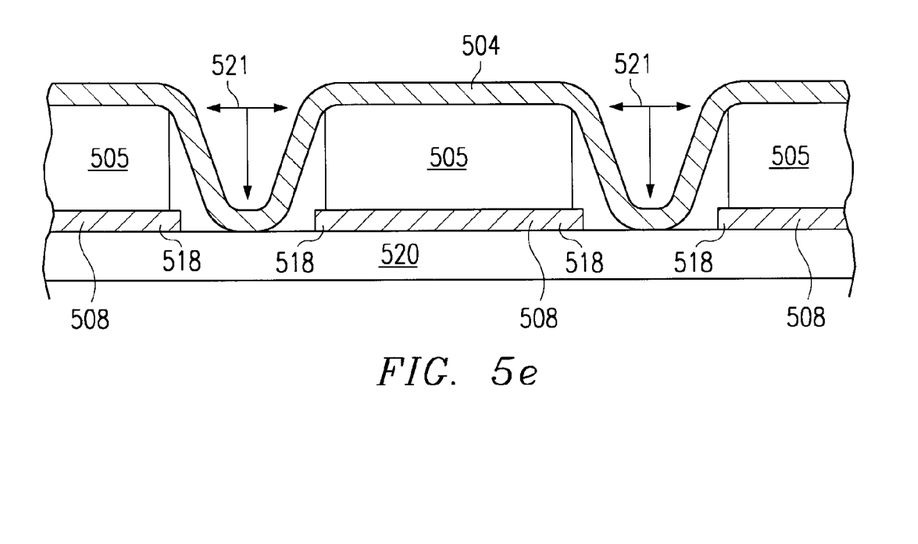

Owing to the ductility and high tensile strength of copper films, the copper film 504 on the second surface of the film is capable of being formed to extend into the etched apertures and substantially through the dielectric film approaching the conductors on the first surface. As shown in FIG. 5e, the first surface 508 of the film is positioned on and supported by a solid die plate 520 in a press. A hydraulic or pneumatic force, represented by arrows 521, is applied to the second surface, whereby the continuous copper film 504 on the second surface is stretch-formed to approximately conform to the aperture sidewalls, and to approach the plane of the first copper surface 508 of the dielectric 505.

Figure 6A:
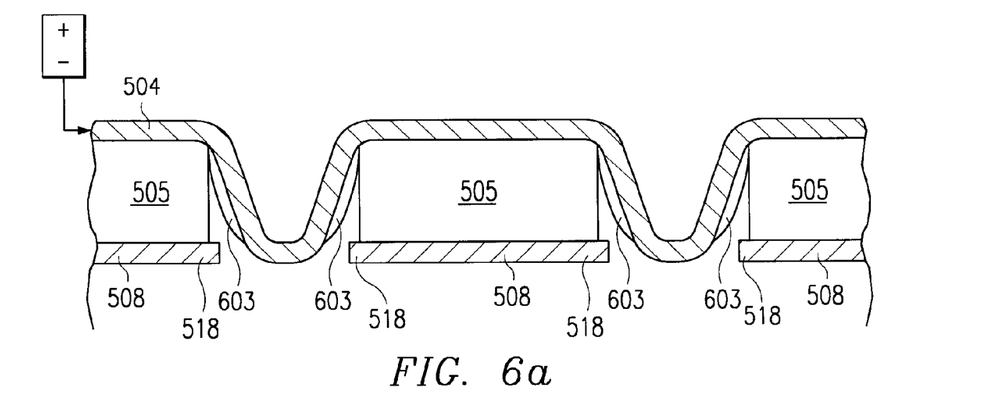
FIGS. 6a–6c illustrate formation of plated copper from the cathode onto a single surface to provide a void free via.
Figure 6B:
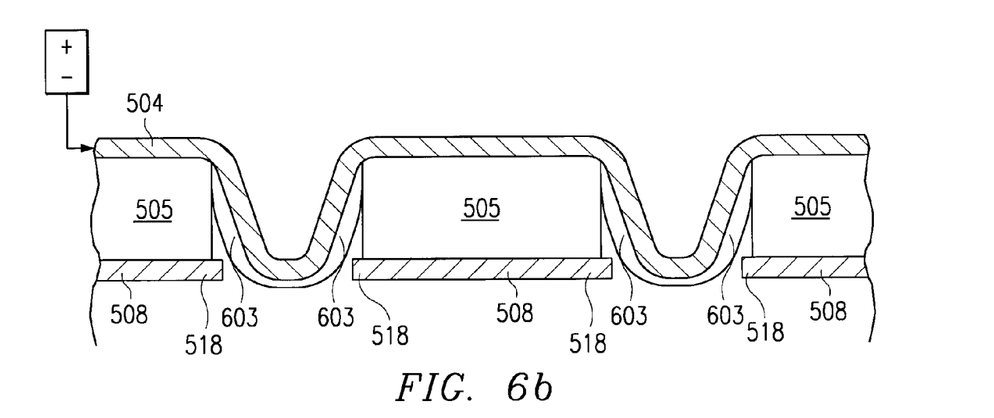
Figure 6C:
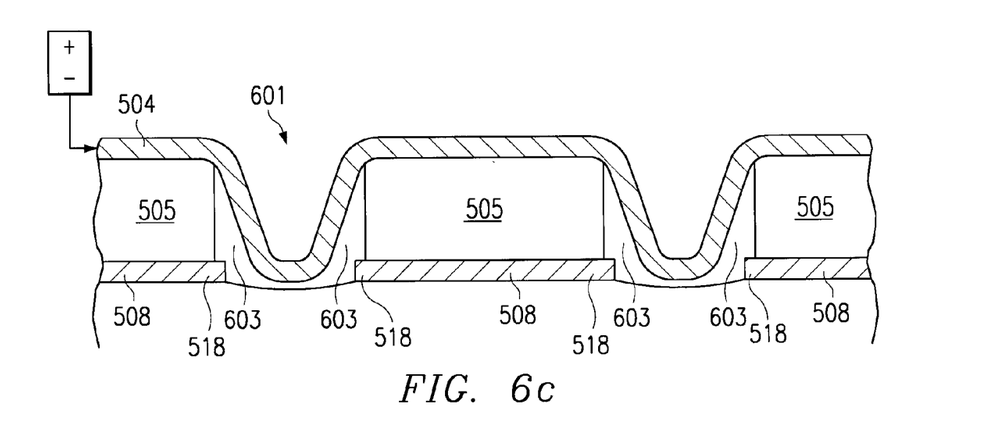

In FIG. 6a, a copper plated layer 603 is initiated from the formed continuous copper film 504. Selective plating is accomplished in the following manner; the continuous copper film 504 on the second surface of the dielectric is brought into contact with the cathode of a copper plating bath, and current applied from a rectifier to the cathode and the anode. In FIG. 6b and 6c, copper proceeds to plate from the top side of the cathode film until the plated copper meshes with the cusps 518 of the conductor layer on the first surface of the dielectric and makes a continuous electrical circuit. In FIG. 6c, the layer of plated copper forms a solid mass between the copper film 504 lining the aperture and the conductor on the first surface, thereby providing a robust conductive via structure. Plating occurs only from a continuous cathode, and at the point when contact between conductors on the first and second surface is continuous, plating will begin to occur on all surfaces.

The preferred embodiment of the current invention provides an intermediate structure for a flex film, having a plurality of conductive vias corresponding to sites for interconnecting the conductors on the surfaces on a flex circuit, wherein the vias 601 have an indention for positioning solder balls, as shown in FIG. 6c.

A second embodiment of an intermediate structure for a flex circuit having conductive vias including a continuous copper film lining attached to the second surface of a dielectric wherein the lining has been press fit into the apertures, and including copper plating providing contact between the copper conductors on the first surface and the via lining copper, further includes partially or fully filling the indented vias with copper plating. The via structure shown in FIG. 3 depicts the vias 302, formed by the same steps as those in the preferred embodiment and shown in in FIGS. 5 and 6, but having the indentation partially filled with plated copper 307. The cavity depth of the indentation is controlled by the amount of additional copper plating 307, and provides a means to select the cavity depth as needed by the solder ball diameter.

Figure 7A:
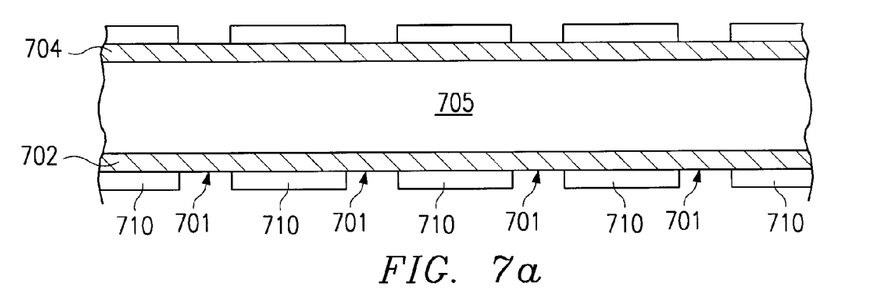
FIGS. 7a–7e illustrate process steps included in forming conductive vias by etching the sites and plating from a single surface.
Figure 7B:
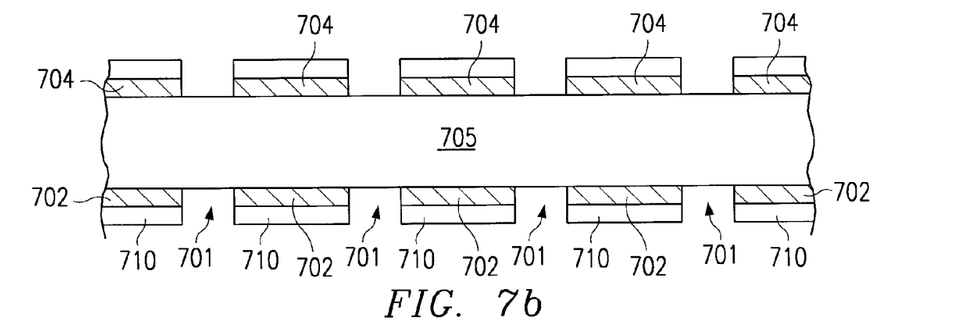

In a related embodiment, vias are fully plated with copper between the conductor surfaces. As shown in FIG. 7a, a commercially available flexible dielectric film 705 having a layer of copper 702 and 704 on the major surfaces, is laminated with photoresist 710 on both surfaces. A photo-pattern corresponding to via sites 701 in a flex circuit is aligned, exposed and developed on each surface using known technology. The exposed copper is etched simultaneously in FIG. 7b using a commercially available copper etch solution, such as an ammoniacal etchant. In the next step, the photoresist is removed and the polymer etched from both surfaces using a caustic etchant and the copper as a mask. As with the previous embodiment, and as shown in FIG. 5d, the copper is undercut providing cusps 518 of copper film overhanging the apertures.

Figure 7C:
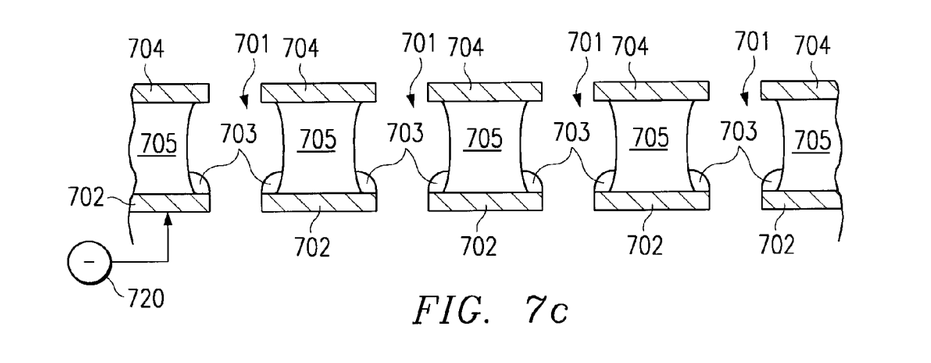
Figure 7D:
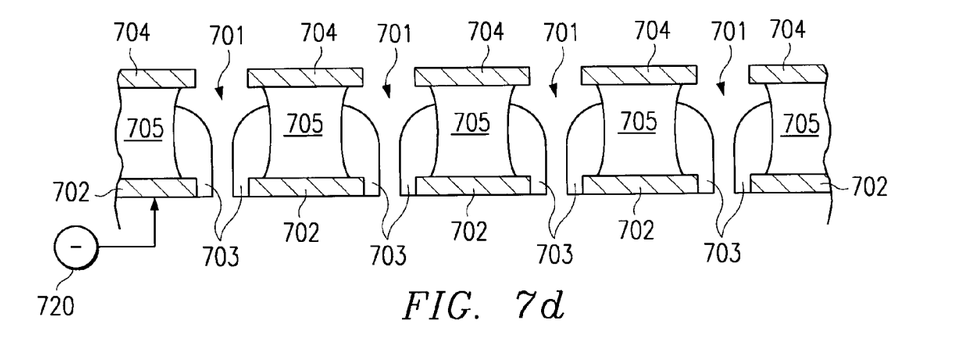
Figure 7E:
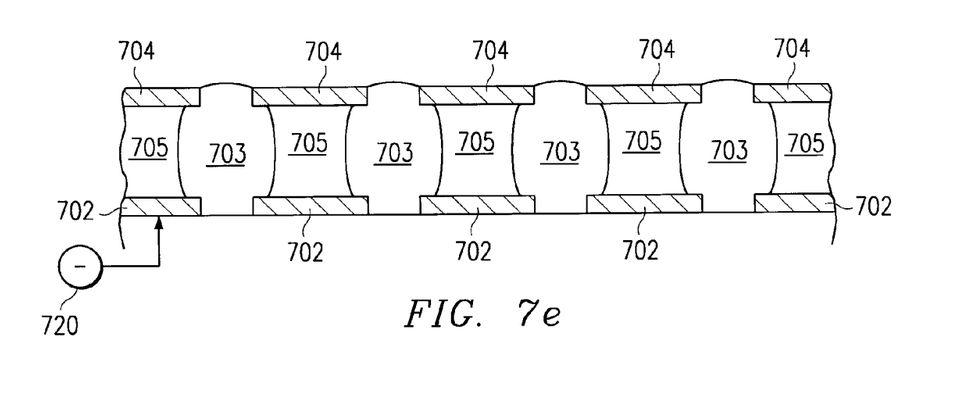

The second surface 702 of the film is brought into intimate contact with the cathode 720 of a copper plating bath, and current applied by a rectifier to the cathode and anode, whereby copper 703 will begin to plate from the cathode and to fill the apertures as shown in FIGS. 7c through 7e. Copper plating proceeds from the single cathode surface, thereby avoiding entrapment of voids and air pockets as is typical of plating which occurs from two surfaces. Current is applied and plating is continued until the plated copper electrically contacts the copper conductors 704 on the first surface of the film. The plated via comprises a solid copper core in contact with the copper film on both surfaces of the dielectric film.

Alternately apertures can be formed by mechanical punching and the dielectric etched to provide a clean dielectric surface suitable for plating, and having copper cusps overhanging the apertures. Plating will be accomplished in the same manner as shown in FIGS. 7c through 7e.

Each of the disclosed methods provides a novel, intermediate structure for a flex circuit wherein a conductive layer on the first surface of a dielectric film is connected to a conductor on the second surface by a plurality of solid copper conductive vias arrayed in a pattern corresponding to that of flex circuit. Known technology is used to complete the circuit by patterning and etching a series of traces in the copper layer on the first surface and a plurality of solder ball contact pads on the second surface of the film. The traces on the first surface provide electrical interconnection from a plurality of lands for solder balls or wire bonds connections from an integrated circuit chip to either a common interconnection between some chip terminals, such as power or ground buses, or the traces terminate at the conductive vias in the intermediate structure. Metallization on the circuits is finished by a layer of nickel and of gold disposed over the exposed copper, using technology known in the art.

Processes and materials required for patterning the circuits and solder ball pads are not unlike those typically used for flex circuit formation except that alignment is to pre-formed conductive vias, rather than patterning conductors on two surfaces, attempting to align the two patterns and connect the vias at the precise locations.

Mechanization for fabricating a flexible circuit for use as an integrated circuit area array package substrate is well adapted to reel to reel film transport. The appropriate film width will be selected for single or multiple packages, as required by the end user's transport equipment. Sprocket holes are located along the edges of the film to mate with those of the transport mechanism. Continuous processing to form an intermediate structure for a flex circuit includes the following steps: alignment of a mask to a dielectric film having a layer of copper on both major surfaces and laminated with photoresist, exposure, development of the resist, and etching the copper and dielectric layers. Continuous processing further includes plating copper from a single surface by means of a drum cathode contact with the conductor surface; such continuous processing is well suited to reel to reel automation. Sprocket driven reel to reel mechanization facilitates photolithography, etching and plating processes as required for the flex circuit production.

While the invention has been described in connection with preferred embodiments, it is not intended to limit the scope to a particular form set forth, but on the contrary, it is intended to cover alternatives, modifications and equivalents as may be included within the spirit of the invention and the scope of the invention as defined by the appended claims.

What is claimed is:

1. A double sided electrical interconnection flexible circuit to enable interconnecting an integrated circuit chip to an external circuit including:

a base dielectric film having a plurality of vias extending from the first major surface to the second major surface of said dielectric, a conductor pattern on the first surface extending in part to the vicinity of selected vias, a plurality of copper film segments on said second surface shaped to provide indented solder ball contact pads which extend in part to the vicinity of selected vias, and a conductive means for selectively interconnecting said conductor patterns with portions of said copper film segments respectively.

2. The flexible circuit as described in claim 1 wherein selected copper film segments extend into said vias and substantially through the thickness of said dielectric.

3. The flexible circuit as described in claim 1 further including a layer of copper partially or fully filling said indentations.

4. The flexible circuit as described in claim 1 which further includes a layer of nickel and of gold over the interconnect patterns and solder ball contact pads.

5. The flexible circuit as described in claim 3 which provides the interconnection circuitry for a substrate of an area array integrated circuit package.

6. The flexible circuit as described in claim 1 wherein said base dielectric film comprises a polyimide polymer in the range of 0.003 to 0.006 inches in thickness.

7. A double sided electrical interconnection flexible circuit substrate for an integrated circuit package to enable interconnecting an integrated circuit chip to an external circuit including:

a base dielectric film in the range of 0.003 to 0.006 inches thickness having a plurality of vias extending from the first major surface to the second major surface of said dielectric, a conductor pattern on the first surface extending in part to the vicinity of selected vias, a plurality of copper film segments on said second surface, selected ones of said segments extending into selected vias, and substantially through the thickness of said dielectric, wherein said segments are shaped to provide solder ball contact pads with indentations on said second surface, a conductive means for selectively interconnecting said conductor patterns with portions of said copper film segments respectively, and a layer of nickel and of gold over the interconnect patterns and solder ball contact pads.

8. The double sided electrical interconnection flexible circuit substrate for an integrated circuit package as in claim 7 wherein said solder ball contact pad indentations are partially or fully filled with a layer of copper.

9. A double sided electrical interconnection flexible circuit substrate for an integrated circuit package to enable interconnecting an integrated circuit chip to an external circuit including:

a base dielectric film in the range of 0.003 to 0.006 inches thickness having a plurality of vias extending from the first major surface to the second major surface of said dielectric, a conductor pattern on the first surface extending in part to the vicinity of selected vias, a plurality of copper film segments on said second surface shaped to provide solder ball contact pads which extend in part to the vicinity of selected vias, a conductive means for selectively interconnecting said conductor patterns with portions of said copper film segments respectively, and a layer of nickel and of gold over the interconnect patterns and solder ball contact pads.

* * * * *